(12) United States Patent
von Malm et al.

(10) Patent No.: US 9,666,756 B2
(45) Date of Patent: May 30, 2017

(54) OPTOELECTRONIC SEMICONDUCTOR MODULE AND DISPLAY HAVING A PLURALITY OF SUCH MODULES

(75) Inventors: Norwin von Malm, Nittendorf (DE); Georg Bogner, Lappersdorf (DE); Joachim Reill, Zeitlarn (DE); Stefan Grötsch, Bad Abbach (DE)

(73) Assignee: OSRAM Opto Semiconductors, GmbH, Regensburg (DE)

( * ) Notice: Subject to any disclaimer, the term of this patent is extended or adjusted under 35 U.S.C. 154(b) by 158 days.

(21) Appl. No.: 14/115,697

(22) PCT Filed: Mar. 16, 2012

(86) PCT No.: PCT/EP2012/054711
§ 371 (c)(1),
(2), (4) Date: Dec. 16, 2013

(87) PCT Pub. No.: WO2012/156121
PCT Pub. Date: Nov. 22, 2012

(65) Prior Publication Data
US 2014/0098556 A1    Apr. 10, 2014

(30) Foreign Application Priority Data

May 19, 2011   (DE) .......................... 10 2011 102 032

(51) Int. Cl.
*H01L 33/00* (2010.01)
*H01L 33/08* (2010.01)
(Continued)

(52) U.S. Cl.
CPC ................ *H01L 33/08* (2013.01); *F21K 9/00* (2013.01); *F21S 48/115* (2013.01); *F21S 48/1154* (2013.01); *F21S 48/1195* (2013.01); *F21S 48/1747* (2013.01); *H01L 25/167* (2013.01); *F21Y 2105/12* (2016.08); *F21Y 2105/14* (2016.08); *F21Y 2115/10* (2016.08); *H01L 25/0753* (2013.01); *H01L 33/20* (2013.01); *H01L 2924/0002* (2013.01)

(58) Field of Classification Search
CPC ....... H01L 33/08; H01L 33/20; H01L 25/167; H01L 25/0753; F21S 48/1747; F21S 48/115; F21K 9/00; F21Y 2105/003; F21Y 2101/02
USPC ............................................ 362/543; 257/88
See application file for complete search history.

(56) References Cited

U.S. PATENT DOCUMENTS 7,731,402 B2   6/2010   Tessnow et al.
7,906,788 B2   3/2011   Nagai
(Continued)

FOREIGN PATENT DOCUMENTS

CN    1542320 A    11/2004
CN    1583465 A    2/2005
(Continued)

*Primary Examiner* — Sharon Payne
(74) *Attorney, Agent, or Firm* — Slater Matsil, LLP

(57) ABSTRACT

An optoelectronic semiconductor module includes a plurality of light-emitting areas, which emit light when in operation. At least two abutting lateral edges of at least one light-emitting area are arranged at an angle of more than 0 degrees and less than 90 degrees to each other. Further embodiments relate to a display having a plurality of such modules.

15 Claims, 2 Drawing Sheets

(51) Int. Cl.
*F21K 9/00* (2016.01)
*F21S 8/10* (2006.01)
*H01L 25/16* (2006.01)
*H01L 25/075* (2006.01)
*H01L 33/20* (2010.01)
*F21Y 105/12* (2016.01)
*F21Y 115/10* (2016.01)
*F21Y 105/14* (2016.01)

(56) References Cited

U.S. PATENT DOCUMENTS

| | | | |
|---|---|---|---|
| 8,585,246 | B2 | 11/2013 | Petersen et al. |
| 8,646,956 | B2 | 2/2014 | Hering et al. |
| 2004/0223337 | A1* | 11/2004 | Ishida .......................... 362/538 |
| 2005/0030760 | A1* | 2/2005 | Capello et al. ............... 362/545 |
| 2005/0041434 | A1* | 2/2005 | Yatsuda et al. ............... 362/459 |
| 2007/0295973 | A1* | 12/2007 | Jinbo ................. H01L 27/1214 257/88 |
| 2008/0018630 | A1* | 1/2008 | Fujino ................. G09G 3/3648 345/205 |
| 2008/0025037 | A1* | 1/2008 | Chinniah et al. ............. 362/545 |
| 2009/0045394 | A1 | 2/2009 | Smeeton et al. |
| 2009/0059565 | A1* | 3/2009 | Bertram ....................... 362/97.2 |
| 2009/0180294 | A1* | 7/2009 | Baur .................... F21S 48/1154 362/545 |
| 2009/0322241 | A1* | 12/2009 | Onushkin et al. ............ 315/250 |
| 2010/0102329 | A1 | 4/2010 | Sakai et al. |

FOREIGN PATENT DOCUMENTS

| | | |
|---|---|---|
| DE | 102005014754 A1 | 10/2006 |
| DE | 102007046339 A1 | 4/2009 |
| DE | 102011015726 A1 | 10/2012 |
| EP | 1505660 A1 | 2/2005 |
| EP | 1842723 A2 | 10/2007 |
| JP | 2004327188 A | 11/2004 |
| JP | 2008532250 A | 8/2008 |
| JP | 2011511447 A | 4/2011 |
| WO | 2006054616 A1 | 5/2006 |
| WO | 2007115523 A1 | 10/2007 |
| WO | 2008109296 A1 | 9/2008 |
| WO | 2009144024 A1 | 12/2009 |

* cited by examiner

OPTOELECTRONIC SEMICONDUCTOR MODULE AND DISPLAY HAVING A PLURALITY OF SUCH MODULES

This patent application is a national phase filing under section 371 of PCT/EP2012/054711, filed Mar. 16, 2012, which claims the priority of German patent application 10 2011 102 032.6, filed May 19, 2011, each of which is incorporated herein by reference in its entirety.

TECHNICAL FIELD

The present invention relates to an optoelectronic semiconductor module having a plurality of light-emitting regions. Furthermore, the present invention relates to a display having a plurality of such semiconductor modules.

BACKGROUND

It is often necessary for the emission direction of a light source whose light is concentrated in a delimited solid angle range, such as in headlights, for example, to be varied during operation. That is of interest in particular in the case of automobile headlights. Rotatable headlight fixtures that are mechanically connected to a controller are known in this case.

Adaptive front headlights, so-called "adaptive front lighting systems," AFS for short, are furthermore known as automobile headlights. Such adaptive front headlights make possible a plurality of different lighting tasks in road traffic in a single lighting system. In particular, lighting scenarios dependent on the traffic situation can thus be produced. In the case of such conventional adaptive front headlights, however, the problem occurs that, in the case of direct projection of the light-emitting diodes, the individual light sources and additionally the dark interspaces are imaged, with the result that homogeneous illumination is not achieved. That is disturbing particularly in the case of automobile headlights. Moreover, conventional adaptive front headlights do not make possible a distinctly pronounced bright-dark transition, such as is prescribed inter alia for the low-beam light.

German Patent Publication Nos. DE 10 2005 014 754 and DE 10 2007 046 339 and European Patent Publication No. EP 1 842 723 disclose, for example, motor vehicle headlights which comprise a plurality of individual LEDs or LED chips which can be driven separately, wherein, in combination with a corresponding optical unit, a variable headlight is thereby made possible.

SUMMARY OF THE INVENTION

Embodiments of the preset application specify an optoelectronic semiconductor module having a varied emission characteristic, which module is suitable in particular for AFS and achieves a distinctly pronounced bright-dark transition, such as is prescribed, for example, for the low-beam light.

In an embodiment, the optoelectronic semiconductor module comprises a plurality of light-emitting regions, which emit light during operation. At least two mutually abutting lateral edges of at least one light-emitting region are arranged at an angle of more than 0° and less than 90° with respect to one another.

The at least one light-emitting region is accordingly not embodied in the form of a square or rectangle, but rather has oblique lateral edges. The oblique embodiment of the lateral edges advantageously makes it possible to form the prescribed angular bright-dark boundary of the low-beam light with particularly high contrast and straight edges. The module according to the invention thus makes possible lighting for example in the area of automotive front lighting without mechanically movable components, this lighting being distinguished by an advantageously high spatial resolution with at the same time the required illuminance.

The plurality of light-emitting regions can be embodied in an integral fashion. In this case, the plurality of light-emitting regions have a common semiconductor body with an active layer suitable for generating radiation. In this case, the light-emitting regions are formed by corresponding energization of the regions of the semiconductor body.

Alternatively, the light-emitting regions can be embodied separately and individually. In this case, each light-emitting region has a separate semiconductor body with an active layer for generating radiation.

The semiconductor module preferably has at least 2×2 light-emitting regions, preferably at least 10×10 light-emitting regions, particularly preferably at least 20×20 light-emitting regions.

The lateral lengths of the at least two mutually abutting lateral edges of the at least one light-emitting region can be embodied with the same length. Alternatively, the lateral lengths of the lateral edges have different length ratios.

In a development, all light-emitting regions of the module have two mutually abutting lateral edges arranged at an angle of more than 0° and less than 90° with respect to one another. Accordingly, all light-emitting regions have oblique lateral edges that are suitable for forming the particularly high contrast and the straight edges of the bright-dark boundary.

In a development, the light-emitting regions of the module are arranged with respect to one another in such a way that the module likewise has oblique lateral edges, that is to say at least two mutually abutting lateral edges arranged at an angle of more than 0° and less than 90° with respect to one another.

In a development, the light-emitting regions are surface emitting regions. The light-emitting regions are preferably suitable for converting electronically generated data or energies into light emission, or vice versa. The light-emitting regions are, in particular, optoelectronic or radiation-emitting regions. For example, the light-emitting regions are an LED, particularly preferably a thin-film LED. In the context of the application, a thin-film LED is considered to be an LED during whose production the growth substrate on which the semiconductor body or bodies was/were grown epitaxially is preferably completely detached.

The light-emitting regions each comprise an active layer or a region of an active layer which preferably has a pn-junction, a double heterostructure, a single quantum well (SQW) structure or a multi quantum well (MQW) structure for generating radiation. The light-emitting regions, in particular layers of the light-emitting regions preferably contain a III/V semiconductor material. III/V semiconductor materials are particularly suitable for generating radiation in the ultraviolet through the visible into the infrared spectral range. Preferably, the light-emitting regions are blue-emitting regions.

In a development, the angle between the two mutually abutting lateral edges is in a range of between 15° and 45° inclusive. In the case of lateral edges having an angle in such a range, it is possible to ensure a particularly good bright-dark boundary with particularly high contrast and straight edges of the module. In one development, all angles of at least one light-emitting region which are formed in each case by mutually abutting lateral edges deviate from 90°. Preferably, all angles of all light-emitting regions of the module deviate from 90°.

In a development, the at least one light-emitting region is embodied in the form of a parallelogram. Preferably, the at least one light-emitting region is embodied in a rhomboidal fashion. Preferably, all light-emitting regions of the module are embodied in the form of a parallelogram. Particularly preferably, the light-emitting regions of the module are arranged with respect to one another in such a way that the module is likewise embodied in the form of a parallelogram.

In a development, the at least one light-emitting region is embodied in the form of a triangle. In this case, therefore, the parallelograms are subdivided again centrally into two separate regions. Preferably, all light-emitting regions of the module are embodied in the form of a triangle. Particularly preferably, the triangular light-emitting regions are arranged with respect to one another in such a way that the module overall is embodied in the form of a parallelogram.

In a development, the light-emitting regions of the module are arranged in a matrix-like fashion. Here in a matrix-like fashion means that the light-emitting regions are arranged in rows and columns and thus form a regular grid. Preferably, adjacent light-emitting regions are in this case at regular and identical distances from one another.

Preferably, the light-emitting regions of a column or of a row can be electronically driven separately from the remaining rows or columns of the module. This advantageously makes possible an extended adjustment by driving the desired rows or columns.

In a development, the light-emitting regions of the module are arranged uniformly in linear series, in alternately oriented series or in a blockwise fashion. The arrangement in linear series makes possible, for example, the shaping of the module as a parallelogram. Alternately oriented series should be understood to mean, in particular, series which are embodied mirror-symmetrically with respect to an axis of symmetry. A blockwise arrangement should be understood to mean, in particular, that the light-emitting regions are arranged in groups, wherein the different groups of the light-emitting regions can have a different configuration of the associated light-emitting regions. By way of example, the first group of light-emitting regions has a rectangular form, while the second group of light-emitting regions is embodied in the form of a parallelogram.

In a development, the distance between two light-emitting regions is between 1 μm and 100 μm inclusive. Preferably, the distance between two light-emitting regions is less than 100 μm, preferably less than 20 μm, particularly preferably less than 10 μm.

In a development, at least one lateral edge of each light-emitting region has a length in a range of between 30 μm and 1 mm inclusive. Preferably, the lateral lengths of the light-emitting regions are less than 1 mm, preferably less than 300 μm, particularly preferably less than 150 μm.

In a development, a primary optical unit and/or a secondary optical unit are/is disposed downstream of the light-emitting regions in the emission direction for the purpose of varying the emission characteristic. In this case, a common primary optical unit and/or common secondary optical unit can be disposed downstream of the light-emitting regions. Alternatively, each light-emitting region can have a separate primary optical unit and/or secondary optical unit. In this case, the light-emitting regions can be at a distance from one another of significantly greater than 100 μm.

In a development, a conversion layer is disposed downstream of the light-emitting regions in the emission direction. In this case, the conversion layer can consist of a layer common to all light-emitting regions of the module. Alternatively, each light-emitting region can have a separate conversion layer. Phosphor particles embedded in a transparent matrix, such as a silicone matrix, for example, or ceramic converters are used as materials of the conversion layer.

Preferably, the light-emitting regions emit blue radiation. The conversion layer is preferably suitable for converting blue radiation into yellow radiation, for example, such that the module overall emits radiation in the white color locus range.

A possible profile of the light color and light intensity of the radiation emitted by the module can be set by the variation of the degree of scattering and/or the geometrical form of the conversion layer.

Crosstalk of the radiation emitted by the individual light-emitting regions can preferably be avoided by virtue of the fact that a mirror layer arranged opposite the coupling-out side is set at a distance from the active layer of the light-emitting region in such a way that a radiation emitted by the active layer in the direction of the coupling-out side interferes with a radiation reflected at the minor layer in such a way that the light-emitting regions have an emission characteristic of the emitted radiation with a preferred direction in the forward direction. Furthermore, crosstalk can also be avoided by means of absorbent or reflective webs between the light-emitting regions.

In a development, the light-emitting regions can be energized in each case independently of one another. For this purpose, by way of example, each light-emitting region is assigned one-to-one to a transistor of an active matrix driving arrangement.

In an embodiment, a display comprises a plurality of optoelectronic semiconductor modules, which are arranged laterally alongside one another. A display can thus be obtained, for example, which is used as a motor vehicle headlight. In this case, the individual modules of the display can be arranged directly alongside one another, thus giving rise to a regular matrix of the light-emitting regions over all modules. Alternatively, the modules of the display can be distributed arbitrarily, that is to say arranged at different distances from one another. This advantageously results in a small decentralized imaging optical unit and thus the possibility of a very flat headlight design. A projection optical unit disposed downstream of the modules in this case preferably combines the individual contributions of the radiation emitted by the modules to form a continuous light matrix.

The features mentioned in connection with the module are also used in association with the display, and vice versa.

In a development, the light-emitting regions belonging to a module can be operated in each case independently of the light-emitting regions of adjacent modules. By way of example, the modules of the display are connected to an active matrix driving arrangement and can be energized thereby separately from one another. Preferably, the light-emitting regions of a module can already be energized in each case independently of one another by virtue of, for example, each light-emitting region being assigned one-to-one to a transistor of the active matrix driving arrangement.

Preferably, the display comprises at least one drive circuit for operating the light-emitting regions of at least one module. By way of example, the display with the optoelectronic modules is extended by electronic components which translate, for example, a conversion of a coded signal from externally into a switching pattern of the arrangement, such as, for example, rows and columns, of the light-emitting regions. In this case, for example, input signals of a CAN bus or of an I²C interface are to be taken into account. In this case, the electronic components and control elements can be embodied in a manner monolithically integrated with the modules or can be embodied as a discrete component.

The active matrix driving arrangement of the display preferably has transistors in the form of a CMOS structure realized in Si, to which the light-emitting regions of the modules are connected. This can be done for example by direct bonding of the semiconductor layers of the light-emitting regions and of the Si wafer or by simultaneous and sequential transfer of the layers of the light-emitting regions on mounting areas of the Si wafer. Alternatively, a growth substrate of the light-emitting regions can also be used as a substrate for the deposition and patterning of, for example, thin-film transistors.

In a development, the display comprises further components such as light sensors, color sensors or temperature sensors, for example, which are integrated into or onto the modules.

In an embodiment, the displays having a plurality of modules are used as an automobile headlight which fulfills different light functions depending on the driving of the light-emitting regions. Examples of appropriate light functions include adaptive dazzle-free high-beam and low-beam light for city/town, country road and expressway, daytime running light, position light, spotlight, cornering light, turning light, automatic luminous range regulation and driver-dependent design of the automobile headlight.

BRIEF DESCRIPTION OF THE DRAWINGS

Further advantages and advantageous developments of the invention will become apparent from the exemplary embodiments described below in conjunction with FIGS. 1 to 4, in which.

In the figures, identical or identically acting constituent parts may be provided in each case with the same reference signs. The illustrated constituent parts and their size relationships among one another should not be regarded as true to scale. Rather, individual constituent parts such as, for example, layers, structures, components and regions may be illustrated with exaggerated thickness or size dimensions in order to enable better illustration and/or in order to afford a better understanding.

DETAILED DESCRIPTION OF ILLUSTRATIVE EMBODIMENTS

Figure 1A:
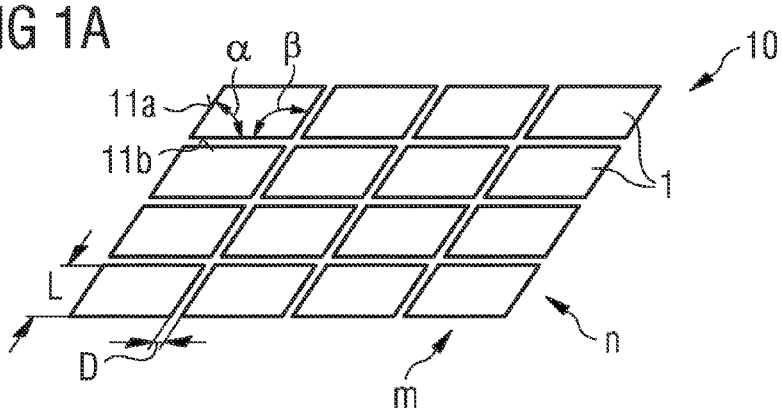
FIGS. 1A to 1D in each case show a schematic view of an exemplary embodiment of a module according to the invention.

FIG. 1A shows a plan view of an optoelectronic semiconductor module 10 comprising a plurality of light-emitting regions, which emit light during operation. In this case, the light-emitting regions 1 are arranged in a matrix-like fashion, for example, on a carrier. That means that the light-emitting regions 1 are arranged in rows n and columns m, such that the arrangement of the light-emitting regions 1 is embodied in a grid-like fashion. In this case, the light-emitting regions 1 have an identical size and are arranged at regular and identical distances from one another. The distance D between the light-emitting regions 1 is between 1 µm and 100 µm inclusive, preferably ≤100 µm, particularly preferably ≤20 µm, preferably ≤10 µm.

The module in FIG. 1A has a matrix comprising 4×4 light-emitting regions. However, the module can also have a number of light-emitting regions that deviates therefrom. By way of example, the module has at least 20×20 light-emitting regions, preferably at least 10×10 light-emitting regions.

The light-emitting regions 1 of the module in FIG. 1A have mutually abutting lateral edges, which are all arranged at an angle that deviates from 90°. In particular, the light-emitting regions 1 are embodied in each case in the form of a parallelogram. The parallelogram here is in each case not embodied as a rectangle or square, on account of the deviation of the angle from 90°. That is to say that none of the lateral edges of the light-emitting regions are at an angle of 90°, that is to say perpendicular to one another. In this case, the parallelogram has a small angle α and in the adjacent corner a further angle β. The smaller angle α is preferably in a range of between 15° and 45° inclusive. Light-emitting regions embodied in this way are particularly suitable for ensuring the provided bright-dark boundary of a low-beam light of an automobile headlight, wherein the bright-dark boundary in this case advantageously forms a high contrast and straight edges. Thus, without mechanically movable components, it is possible to obtain different headlight functions with different illuminations in a single module, a high spatial resolution and a high illuminance simultaneously being produced.

The light-emitting regions 1 are arranged in rows n and columns m in such a way as to result in a regular, uniform arrangement of the light-emitting regions 1 which is divided into linear series and linear columns.

The light-emitting regions 1 are additionally arranged with respect to one another in such a way that the module 10 overall likewise forms a parallelogram in which two mutually abutting lateral edges are embodied obliquely with respect to one another, that is to say likewise have the angle α that is more than 0° and less than 90°.

The lateral edges 11a of each light-emitting region 1 have a length L in a range of between 30 µm and 1 mm inclusive. Preferably, the lateral lengths are ≤1 mm, preferably ≤300 µm, particularly preferably ≤150 µm. In this case, the lateral edges of the light-emitting regions can have different length ratios.

The light-emitting regions 1 are formed from semiconductor material. Preferably, the light-emitting regions 1 are formed from a semiconductor body having an active layer that is suitable and provided for generating radiation. In this case, the individual light-emitting regions 1 of a module 10 can have a common semiconductor body or semiconductor bodies arranged adjacent separately from one another.

By way of example, the light-emitting regions 1 are in each case an LED, which preferably emits radiation in the blue wavelength range.

Figure 1B:
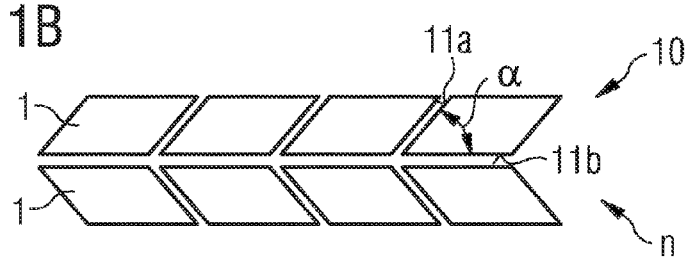

In contrast to the exemplary embodiment in FIG. 1A, the light-emitting regions 1 in FIG. 1B are arranged in alternately oriented series n with respect to one another. That means that the light-emitting regions 1 are arranged minor-symmetrically with respect to an axis of symmetry. In this case, all light-emitting regions 1 of the module 10 in accordance with the exemplary embodiment in FIG. 1B once again have in each case mutually oblique lateral edges 11a, 11b which form an angle α with one another that is more than 0° and less than 90°.

Figure 1C:
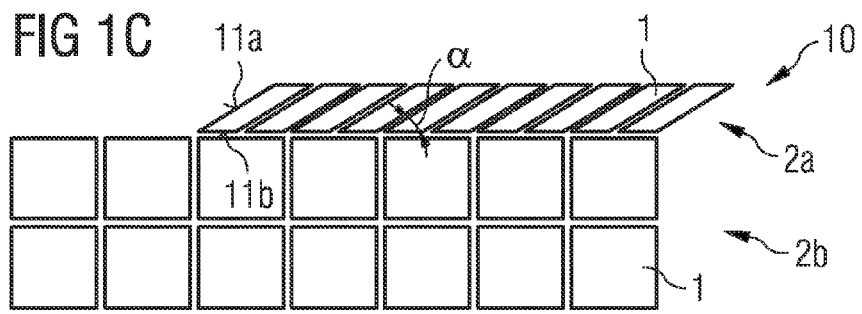

The module of the exemplary embodiment in FIG. 1C differs from the module in FIG. 1A in that the light-emitting regions 1 are arranged in a blockwise fashion. That means that the light-emitting regions 1 can be divided into two groups 2a, 2b, wherein all light-emitting regions of a group are embodied identically to one another. By way of example, the light-emitting regions 1 of the first group 2a are embodied in the form of a parallelogram having mutually oblique lateral edges 11a, 11b that form an angle α of more than 0° and less than 90°. The light-emitting regions 1 of the second group 2b are embodied in the form of a rectangle or a square. These light-emitting regions 1 therefore have lateral edges that are perpendicular to one another.

Figure 1D:
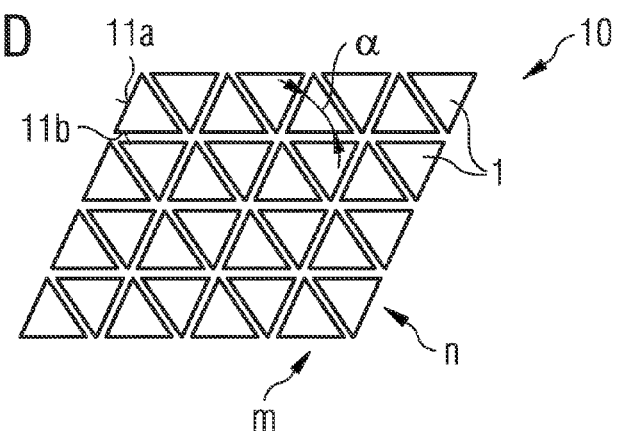

The exemplary embodiment of a module 10 as illustrated in FIG. 1D has, in contrast to the exemplary embodiment of the module in FIG. 1A, centrally divided light-emitting regions present in parallelogram form. The light-emitting regions 1 of the module 10 in FIG. 1D are thus embodied as a triangle. In this case, the light-emitting regions embodied as a triangle again have two lateral edges 11a and 11b that form an angle α with one another that deviates from 90°. In this case, the angle α is preferably 45° or 15°. The light-emitting regions 1 are once again divided into rows n and columns m and thus form a matrix-like grid.

Figure 2A:
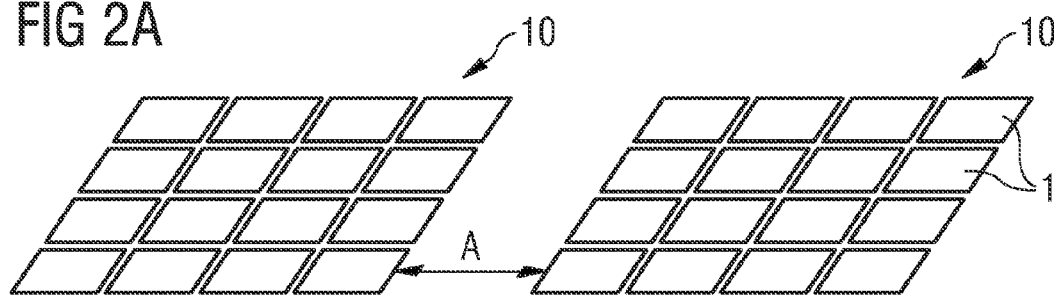
FIGS. 2A-2B, 3 and 4 in each case show a schematic view of an exemplary embodiment of a display according to the invention.

FIG. 2 shows a display comprising a plurality of optoelectronic semiconductor modules 10, which are arranged laterally alongside one another. The modules 10 of the display in FIG. 2A correspond to the module of the exemplary embodiment in FIG. 1A.

In this case, the modules 10 are arranged at a distance A from one another. Alternatively, the modules 10 can be arranged directly alongside one another in such a way as to give rise to a regular matrix of the light-emitting regions over all modules (not illustrated).

In this case, the number of modules 10 of the display can deviate from the exemplary embodiment shown in FIG. 2A. In particular, more than two modules 10 can form a display.

The light-emitting regions 1 belonging to a module 10 can preferably be operated in each case independently of the light-emitting regions of adjacent modules. By way of example, a drive circuit is used for this purpose. By way of example, the display and the associated modules are energized by means of an active matrix driving arrangement. For this purpose, by way of example, each light-emitting region is assigned one-to-one to a transistor of the active matrix driving arrangement, whereby the light-emitting regions can be energized independently of one another. Such an active matrix driving arrangement is discussed in greater detail in connection with the exemplary embodiment in FIG. 3.

Figure 2B:
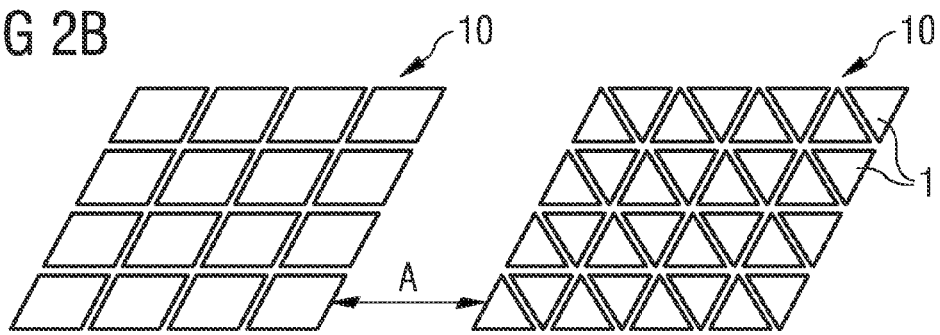

The exemplary embodiment in FIG. 2B differs from the exemplary embodiment in FIG. 2A in that differently configured modules 10 are used for the display. One of the modules 10 is embodied for example in accordance with the module in FIG. 1A, while the second module 10 corresponds to a module in accordance with the exemplary embodiment in FIG. 1D. Depending on the desired emission characteristic, a plurality of different modules can thus be combined to form a display. In this case, the combination of different modules 10 is dependent, for example, on the desired light function of the display. An appropriate light function includes, inter alia, an adaptive dazzle-free high-beam and low-beam light for city/town, country road and expressway, a daytime running light, a position light, a spotlight, a cornering light, a turning light, an automatic luminous range regulation and driver-dependent design of the headlight.

Figure 3:
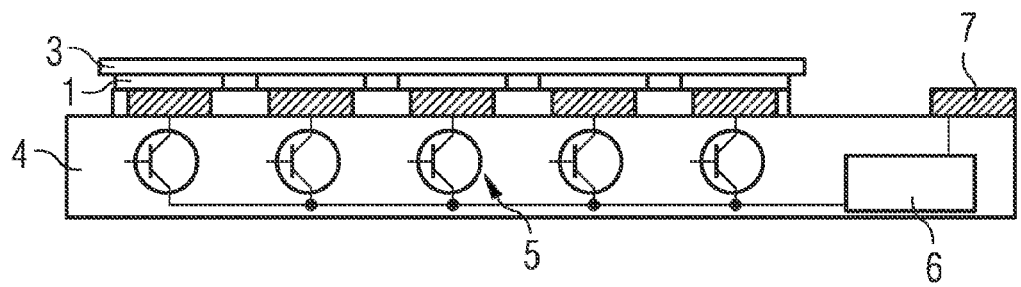

FIG. 3 shows a cross section of a display according to the invention, said display comprising at least one module having light-emitting regions arranged on an active matrix driving arrangement 4, 5, 6, 7. In comparison with the exemplary embodiments in FIGS. 2A and 2B, therefore, the display is extended by electronic components which translate, for example, the conversion of a coded signal from externally into a switching pattern of the rows and columns of the modules. By way of example, input signals of a CAN bus or of an I$^2$C interface are to be taken into account in this case. The electronic control elements in this case can be embodied in a monolithically integrated fashion or as discrete components.

The active matrix driving arrangement has transistors 5, for example, which are present in the form of a CMOS structure realized in Si, the light-emitting regions of the module being electrically and mechanically connected one-to-one to said structure. This can be realized, for example, by direct bonding of the light-emitting regions and transistors. Alternatively, the light-emitting regions can be mounted sequentially or simultaneously on mounting areas of the Si wafer of the transistors. Alternatively, a growth substrate used for growing the layers of the light-emitting regions 1 can also be used as a substrate for depositing and patterning the thin-film transistors 5.

The active matrix in FIG. 3 has, besides the transistors 5, the active matrix 4 composed of Si, a microcontroller 6 and a connection region 7.

A conversion layer 3 is arranged on the light-emitting regions, in particular on a radiation exit side of the light-emitting regions 1. The conversion layer 3 is accordingly disposed downstream of the light-emitting regions 1 in the emission direction. The conversion layer 3 comprises, for example, phosphor particles embedded in a transparent matrix, such as silicone, for example, or ceramic converters. Preferably, the light-emitting regions 1 emit blue radiation, which is converted into yellow radiation by the conversion layer 3, such that overall the display emits white light.

In the exemplary embodiment in FIG. 3, the conversion layer 3 as a common layer is disposed downstream of all light-emitting regions of a module.

In the display of the exemplary embodiment in FIG. 3, further electronic components can additionally be integrated (not illustrated), such as, for example, light sensors, color sensors or temperature sensors.

Figure 4:
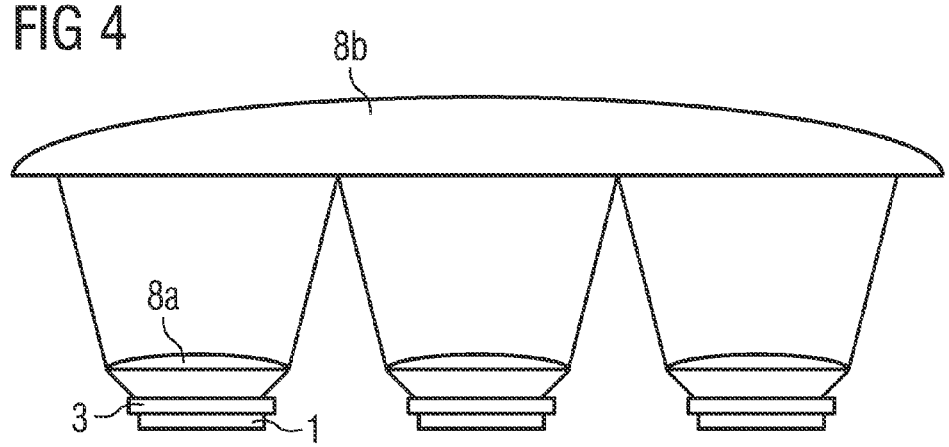

In the exemplary embodiment in FIG. 4, a further display is shown, in which, in contrast to the display illustrated in FIG. 3, a primary optical unit 8a and a secondary optical unit 8b are disposed downstream of the light-emitting regions 1 in the emission direction. In this case, the primary optical unit 8a influences the radiation emitted by the light-emitting regions 1 in a predetermined manner. A separate primary optical unit 8a is disposed downstream of each light-emitting region 1. The secondary optical unit 8b is furthermore disposed downstream of the primary optical units 8a in the emission direction, the secondary radiation 8b being common to all the light-emitting regions. Between the primary optical units 8a and the secondary optical unit 8b, the light emission of the individual light-emitting regions 1 is shown by means of lines in FIG. 4.

In contrast to the exemplary embodiment in FIG. 3, the conversion layer 3 of the exemplary embodiment in FIG. 4 has separate regions. By way of example, exactly one conversion layer is disposed downstream of each separate light-emitting region 1, wherein the conversion layers of the individual light-emitting regions are spatially and mechanically separated from one another.

As a result of the coupling of the radiation emitted by the light-emitting regions 1 by means of the primary optical units 8a and the secondary optical unit 8b, the light-emitting regions 1 can be arranged at a large distance from one another, in particular at a distance from one another that is greater than 100 µm. In this case, the secondary optical unit 8b is preferably suitable for combining the individual contributions of the light-emitting regions to form a continuous light matrix.

The invention is not restricted to the exemplary embodiments by the description on the basis of said exemplary embodiments, but rather encompasses any novel feature and also any combination of features, which in particular includes any combination of features in the patent claims, even if these features or these combinations themselves are not explicitly specified in the patent claims or exemplary embodiments.

The invention claimed is:

1. A radiation-emitting semiconductor module comprising:
    a plurality of light-emitting regions configured to emit light;
    an active matrix driving arrangement for driving the light-emitting regions; and
    a temperature sensor,
    wherein at least two mutually abutting lateral edges of at least one light-emitting region are arranged at an angle of more than 0° and less than 90° with respect to one another,
    wherein the light-emitting regions are divided into first and second groups and all light-emitting regions within each group are embodied identically to one another,
    wherein the light-emitting regions of the first group are embodied in form of a parallelogram and the angle is in a range of between 15° and 45° inclusive,
    wherein the light-emitting regions of the second group are embodied in form of a rectangle or a square,
    wherein the groups are arranged laterally alongside one another and are independently energizable,
    wherein a distance between two adjacent light-emitting regions is between 1 µm and 20 µm inclusive,
    wherein a common conversion layer is disposed downstream of the light-emitting regions in an emission direction, and
    wherein the active matrix driving arrangement comprises transistors which are present in form of CMOS structures realized in silicon, the light-emitting regions of the module are electrically and mechanically connected one-to-one to the transistors in CMOS structure.

2. The module according to claim 1, wherein the first group consists of 10 light-emitting regions arranged in one line and the second group consists of 14 light-emitting regions arranged in two lines.

3. The module according to claim 1, wherein the angle of the first group is 45°.

4. The module according to claim 1, wherein the light-emitting regions of the second group are embodied in form of the square.

5. The module according to claim 1, wherein the light-emitting regions of the second group are arranged in two equal lines.

6. The module according to claim 1, wherein the module has at least 20×20 light-emitting regions.

7. The module according to claim 1, wherein the light-emitting regions are arranged in a matrix fashion.

8. The module according to claim 1, wherein the light-emitting regions are arranged uniformly in a blockwise fashion.

9. The module according to claim 1, wherein at least one lateral edge of each light-emitting region has a length in a range of between 30 µm and 1 mm, inclusive.

10. The module according to claim 1, wherein a primary optical unit and a secondary optical unit are disposed downstream of the light-emitting regions in an emission direction.

11. The module according to claim 1, wherein the light-emitting regions are each independently energizable.

12. The module according to claim 1, wherein the plurality of light-emitting regions have a common semiconductor body with an active layer suitable for generating radiation so that the light-emitting regions are formed by corresponding energization regions of the semiconductor body.

13. A radiation-emitting semiconductor module comprising:
    a plurality of light-emitting regions configured to emit light, the plurality of light-emitting regions has a common semiconductor body with an active layer configured to generate radiation; and
    an active matrix driving arrangement for driving the light-emitting regions,
    wherein the light-emitting regions are divided into first and second groups and all light-emitting regions within each group are embodied identically to one another,
    wherein the light-emitting regions of the first group are embodied in form of a parallelogram and at least two mutually abutting lateral edges of the light emitting regions of the first group are arranged at an angle in a range of between 15° and 45° inclusive,
    wherein the light-emitting regions of the second group are embodied in form of a rectangle or a square,
    wherein the first and second groups are arranged laterally alongside one another,
    wherein a conversion layer is disposed downstream of the light-emitting regions in an emission direction, and
    wherein the active matrix driving arrangement comprises transistors which are present in form of CMOS structures realized in a silicon wafer, the light-emitting regions of the module are electrically and mechanically connected one-to-one to the transistors by direct bonding of the semiconductor body and the silicon wafer.

14. An automobile headlight comprising:
    a plurality of optoelectronic semiconductor modules according to claim 13, the modules being arranged directly laterally alongside one another and giving rise to a regular matrix of the light-emitting regions over all modules;
    a drive circuit for operating the light-emitting regions of at least one of the modules; and
    a projection optical unit disposed downstream of the modules, the projection optical unit configured to combine individual contributions of the radiation emitted by the modules and to form a continuous light matrix,
    wherein the automobile headlight fulfills different light functions depending on the driving of the light-emitting regions.

15. A radiation-emitting semiconductor module comprising:
    a plurality of light-emitting regions configured to emit light;
    a single active matrix driving arrangement for driving the light-emitting regions; and
    a temperature sensor integrated in the module,
    wherein at least two mutually abutting lateral edges of at least one light-emitting region are arranged at an angle of more than 0° and less than 90° with respect to one another, wherein the light-emitting regions are divided into first and second groups and all light-emitting regions within each group are embodied identically to one another, wherein the plurality of light-emitting regions has a common semiconductor body with an active layer suitable for generating radiation, wherein the light-emitting regions of the first group are embodied in form of a parallelogram and the angle is in a range of between 15 degrees and 45 degrees inclusive, wherein the light-emitting regions of the second group are embodied in form of a rectangle or a square, wherein the groups are arranged laterally alongside one another and are independently energizable, wherein the light-emitting regions are arranged at regular and identical distances from one another and the distances between two adjacent light-emitting regions are between 1 µm and 20 µm inclusive in each case, wherein a common conversion layer with a constant thickness is disposed downstream of the light-emitting regions in an emission direction, wherein the conversion layer comprises ceramic converters, wherein the light-emitting regions emit blue radiation which is converted into yellow radiation by the conversion layer such that overall a display emits white light, wherein the active matrix driving arrangement comprises silicon, transistors in CMOS structure, a micro controller and connection regions, wherein each light emitting region is assigned to a transistor in a one-to-one fashion, wherein the active matrix driving arrangement is electrically and mechanically directly connected to the light emitting regions via the connection regions by direct bonding, and wherein the light-emitting regions are located between the active matrix driving arrangement and the conversion layer so that the conversion layer is not in direct contact with the active matrix driving arrangement.

* * * * *